(12) United States Patent
Hu (10) Patent No.: US 11,367,777 B2
(45) Date of Patent: Jun. 21, 2022

(54) DISPLAY PANEL AND MANUFACTURING METHOD THEREOF (71) Applicant: TCL CHINA STAR OPTOELECTRONICS TECHNOLOGY CO., LTD., Shenzhen (CN)

(72) Inventor: Xiaobo Hu, Shenzhen (CN)

( * ) Notice: Subject to any disclaimer, the term of this patent is extended or adjusted under 35 U.S.C. 154(b) by 182 days.

(21) Appl. No.: 16/627,811

(22) PCT Filed: Dec. 24, 2019

(86) PCT No.: PCT/CN2019/127766
§ 371 (c)(1),
(2) Date: Dec. 31, 2019

(87) PCT Pub. No.: WO2021/114392
PCT Pub. Date: Jun. 17, 2021

(65) Prior Publication Data
US 2021/0399110 A1 Dec. 23, 2021

(30) Foreign Application Priority Data

Dec. 13, 2019 (CN) .......................... 201911282711.1

(51) Int. Cl.
H01L 29/49 (2006.01)
H01L 27/12 (2006.01)
H01L 29/40 (2006.01)
H01L 29/66 (2006.01)

(52) U.S. Cl.
CPC ........ *H01L 29/4908* (2013.01); *H01L 27/124* (2013.01); *H01L 27/1259* (2013.01); *H01L 29/401* (2013.01); *H01L 29/66742* (2013.01)

(58) Field of Classification Search
CPC ............... H01L 29/4908; H01L 29/401; H01L 29/66742; H01L 27/124; H01L 27/1259
USPC .......................................................... 257/72
See application file for complete search history.

(56) References Cited

U.S. PATENT DOCUMENTS

2016/0233291 A1  8/2016  Lim et al.
2020/0343329 A1  10/2020  Wang et al.

FOREIGN PATENT DOCUMENTS

CN    104698661 A  *  6/2015
CN    105374845 A     3/2016
CN    107946322 A     4/2018
CN    108321171 A     7/2018

* cited by examiner

*Primary Examiner* — Tong-Ho Kim (57) ABSTRACT

The present disclosure provides a display panel, which includes a base substrate and an array layer disposed on the base substrate. The array layer includes a gate layer disposed on the base substrate; and the gate layer includes a first conductive metal layer, and a first molybdenum alloy layer and a first molybdenum oxide alloy layer sequentially stacked on the first conductive metal layer.

13 Claims, 5 Drawing Sheets

DISPLAY PANEL AND MANUFACTURING METHOD THEREOF

FIELD OF INVENTION

The present disclosure relates to the field of display technologies, and more particularly, to a display panel and manufacturing method thereof.

BACKGROUND OF INVENTION

Currently, conductive layers such as gates in large-sized display panel products are generally made of metals such as Cu. A reflectance of visible light of a surface of the Cu film reaches 90%, and there is no blockage. The visible light reaching the surface of the Cu film will be reflected, causing the reflectivity of the products to be high and affecting visual effect.

SUMMARY OF INVENTION

In a first aspect, an embodiment of the present disclosure provides a display panel including a base substrate and an array layer disposed on the base substrate, and the array layer including a gate layer disposed on the base substrate; wherein the gate layer includes a first conductive metal layer, and a first molybdenum alloy layer and a first molybdenum oxide alloy layer sequentially stacked on the first conductive metal layer, and a material of the first conductive metal layer comprising at least one 1 of copper, aluminum, and silver.

In some embodiments, the first molybdenum alloy layer covers the first conductive metal layer, and the first molybdenum oxide alloy layer covers the first molybdenum alloy layer.

In some embodiments, a thickness of the first molybdenum oxide alloy layer is less than or equal to a thickness of the first molybdenum alloy layer.

In some embodiments, the gate layer further includes a first buffer layer disposed between the first conductive metal layer and the base substrate, the first buffer layer is disposed on the base substrate, and the first conductive metal layer is disposed on the first buffer layer.

In some embodiments, the array layer further includes:
a gate insulating layer covering the gate layer;
an active layer disposed on the gate insulating layer and a source-drain metal layer electrically connected to the active layer;
a passivation layer covering the active layer and the source-drain metal layer; and
a pixel electrode layer disposed on the passivation layer;
wherein the source-drain metal layer includes a second buffer layer disposed on the passivation layer, a second conductive metal layer disposed on the second buffer layer, and a second molybdenum alloy layer and a second molybdenum oxide alloy layer stacked on the second conductive metal layer.

In some embodiments, the pixel electrode layer is in contact with the second molybdenum alloy layer through a through-hole penetrating the passivation layer and the second molybdenum oxide alloy layer.

In some embodiments, a material of each of the first molybdenum alloy layer and the second molybdenum alloy layer comprising at least one of titanium, nickel, tantalum, tungsten, and niobium.

In a second aspect, the present disclosure further provides a display panel including a base substrate and an array layer disposed on the base substrate, and the array layer includes a gate layer disposed on the base substrate;

wherein the gate layer includes a first conductive metal layer, and a first molybdenum alloy layer and a first molybdenum oxide alloy layer sequentially stacked on the first conductive metal layer.

In some embodiments, the first molybdenum alloy layer covers the first conductive metal layer, and the first molybdenum oxide alloy layer covers the first molybdenum alloy layer.

In some embodiments, a thickness of the first molybdenum oxide alloy layer is less than or equal to a thickness of the first molybdenum alloy layer.

In some embodiments, the gate layer further includes a first buffer layer disposed between the first conductive metal layer and the base substrate, the first buffer layer is disposed on the base substrate, and the first conductive metal layer is disposed on the first buffer layer.

In some embodiments, the array layer further includes:
a gate insulating layer covering the gate layer;
an active layer disposed on the gate insulating layer and a source-drain metal layer electrically connected to the active layer;
a passivation layer covering the active layer and the source-drain metal layer; and
a pixel electrode layer disposed on the passivation layer;
wherein the source-drain metal layer includes a second buffer layer disposed on the passivation layer, a second conductive metal layer disposed on the second buffer layer, and a second molybdenum alloy layer and a second molybdenum oxide alloy layer stacked on the second conductive metal layer.

In some embodiments, the pixel electrode layer is in contact with the second molybdenum alloy layer through a through-hole penetrating the passivation layer and the second molybdenum oxide alloy layer.

In some embodiments, a material of each of the first molybdenum alloy layer and the second molybdenum alloy layer comprising at least one of titanium, nickel, tantalum, tungsten, and niobium.

In a third aspect, the present disclosure further provides a method of manufacturing a display panel, including the following steps:
S10: forming an array layer on a base substrate;
wherein the step S10 includes:
S11. forming a first conductive metal layer on the base substrate;
S12. forming a first molybdenum alloy layer and a first molybdenum oxide alloy layer sequentially stacked on the first conductive metal layer.

In some embodiments, the step S12 includes:
S121. forming a first molybdenum alloy film layer on the first conductive metal layer by using a molybdenum alloy layer;
S122. performing oxidation treatment on the surface of the first molybdenum alloy film layer to form the first molybdenum oxide alloy layer with a predetermined thickness.

In some embodiments, before step S11, the method of manufacturing the display panel further includes:
S13: forming a first buffer layer on the base substrate;
wherein the first conductive metal layer is formed on the first buffer layer.

In some embodiments, the step S10 further includes:
S14. forming a gate insulating layer on the base substrate to cover the first conductive metal layer, the first molybdenum alloy layer, and the first molybdenum oxide alloy layer;

S15: forming an active layer on the gate insulating layer;

S16. forming a source-drain metal layer electrically connected to the active layer on the gate insulating layer;

S17, forming a passivation layer covering the active layer and the source-drain metal layer; and S18: forming a pixel electrode layer on the passivation layer;

wherein the source-drain metal layer includes a second buffer layer disposed on the passivation layer, a second conductive metal layer disposed on the second buffer layer, and a second molybdenum alloy layer and a second molybdenum oxide alloy layer sequentially stacked on the second conductive metal layer.

Using a first molybdenum oxide alloy layer disposed on a first conductive metal layer to reduce a light reflectance of a surface of a gate layer, and using a second molybdenum oxide alloy layer disposed on a second conductive metal layer to reduce a light reflectance of a surface of a source and a drain, thereby preventing a high light reflectance from affecting a visual effect of a product, while preventing galvanic corrosion between the first conductive metal layer and the first molybdenum oxide alloy layer through the first molybdenum alloy layer, and preventing galvanic corrosion between the second conductive metal layer and the second molybdenum oxide alloy layer through the second molybdenum alloy layer.

DETAILED DESCRIPTION OF PREFERRED EMBODIMENTS

Currently, conductive layers such as gates in large-sized display panel products are generally made of metals such as Cu. There is no blockage on the Cu film, causing reflectivity of the product to be high and affecting the visual effect. The present disclosure can solve the above problems.

Figure 1:
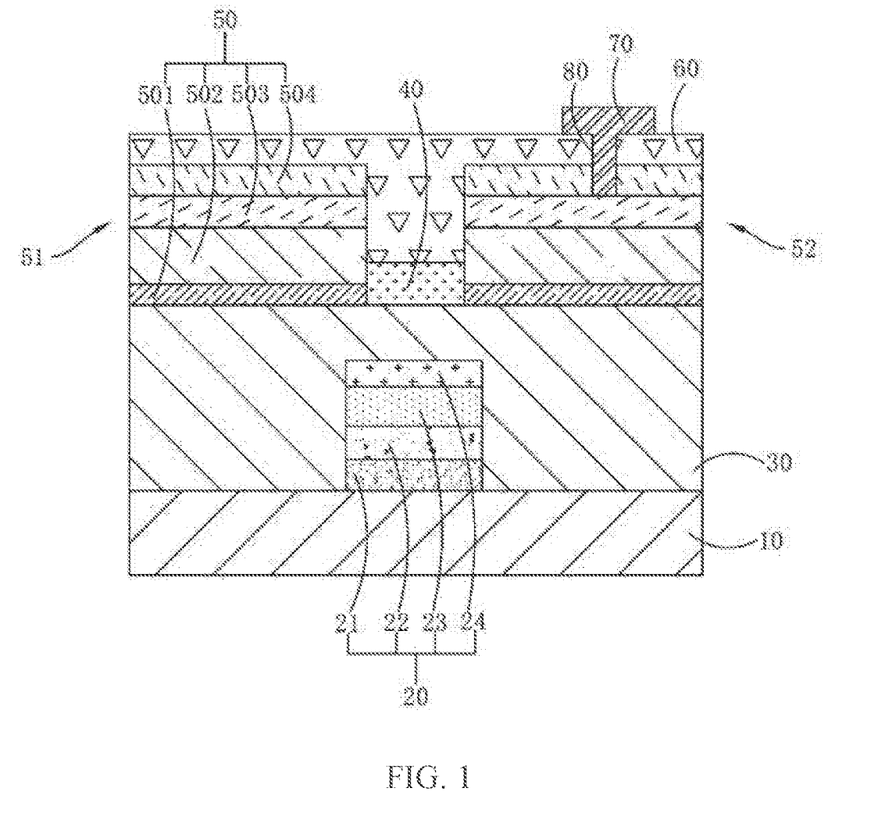
FIG. 1 is a schematic structural diagram of a display panel according to an embodiment of the present disclosure.

A display panel as shown in FIG. 1 is presented. The display panel includes a base substrate 10 and an array layer disposed on the base substrate 10. The array layer includes a gate layer 20 disposed on the base substrate 10. The gate layer 20 includes a first conductive metal layer 22, and a first molybdenum alloy layer 23 and a first molybdenum oxide alloy layer 24 sequentially stacked on the first conductive metal layer 22.

A material of the first conductive metal layer 22 can be one or more of copper, aluminum, and silver.

A material of the first molybdenum alloy layer 23 includes at least one of titanium, nickel, tantalum, tungsten, or niobium.

It should be noted that the material of the first molybdenum alloy layer 23 mainly includes at least one of titanium, nickel, tantalum, tungsten, or niobium doped in molybdenum metal to form a molybdenum alloy, which can prevent galvanic corrosion when the first molybdenum alloy layer 23 is etched, and facilitates forming of a predetermined pattern by etching the first molybdenum alloy layer 23.

Those skilled in the art can know that a light reflectance of a film layer formed of molybdenum oxide alloy is greater than a light reflectance of a film layer formed of a metal such as copper, aluminum, or silver. Generally, the light reflectance of the film layer formed of molybdenum oxide alloy can reach a minimum of 5%. Using the first molybdenum oxide alloy layer 24 disposed on the first conductive metal layer 22 can reduce a light reflectance on the surface of the gate layer 20, preventing the high light reflectance of the product from affecting the visual effect. By disposing the first molybdenum alloy layer 23 between the first conductive metal layer 22 and the first molybdenum oxide alloy layer 24, galvanic corrosion between the first conductive metal layer 22 and the first molybdenum oxide alloy layer 24 is prevented, because the molybdenum alloy has relatively stable chemical properties.

It should be noted that the film layer formed by the molybdenum alloy also has a lower light reflectance than the film layer formed by metal such as copper, aluminum, or silver. In an embodiment of the present disclosure, the first molybdenum alloy layer 23 may also only be disposed on the first conductive metal layer 22 to reduce the light reflectance of the surface of the gate layer 20 and reduce costs of the molybdenum oxide alloy.

Specifically, the first molybdenum alloy layer 23 covers the first conductive metal layer 22 to achieve better insulation effect; the first molybdenum oxide alloy layer 24 covers the first molybdenum alloy layer 23 to prevent light reflected from the surface of the first conductive metal layer 22.

Specifically, a thickness of the first molybdenum oxide alloy layer 24 is less than or equal to a thickness of the first molybdenum alloy layer 23.

The thickness of the first molybdenum alloy layer 23 is 100 to 1000 angstroms, and the thickness of the first molybdenum oxide alloy layer 24 is 100 to 500 angstroms. The first molybdenum oxide alloy layer 24 and the first conductive metal layer 22 is blocked by the first molybdenum alloy layer 23 with sufficient thickness, while the thickness of the first molybdenum alloy layer 23 is reduced to decrease costs.

Specifically, the gate layer 20 further includes a first buffer layer 21 disposed between the first conductive metal layer 22 and the base substrate 10. The first buffer layer 21 is disposed on the base substrate 10, and the first conductive metal layer 22 is disposed on the first buffer layer 21.

It should be noted that a material of the first buffer layer 21 can be one or more of molybdenum, titanium, nickel, tantalum, tungsten, and niobium for increasing adhesion of the first conductive metal layer 22 and preventing a metal of the first conductive metal layer 22 from diffusing into the base substrate 10.

In one embodiment, the array layer further includes a gate insulating layer 30 covering the gate layer 20, an active layer 40 disposed on the gate insulating layer 30, a source-drain metal layer 50 electrically connected to the active layer 40, a passivation layer 60 covering the active layer 40 and the source-drain metal layer 50, and a pixel electrode layer 70 disposed on the passivation layer 60.

The source-drain metal layer 50 includes a second buffer layer 501 disposed on the passivation layer 60, a second conductive metal layer 502 disposed on the second buffer layer 501, and a second molybdenum alloy layer 503 and a second molybdenum oxide alloy layer 504 sequentially stacked on the second conductive metal layer 502.

It should be noted that the second buffer layer 501 prevents a metal of the second conductive metal layer 502 from diffusing downward. A manufacturing material of the second buffer layer 501 may be same as or different from a manufacturing material of the first buffer layer 21.

It should be noted that the second molybdenum oxide alloy layer 504 reduces a light reflectance of a surface of the source-drain metal layer 50, and the second molybdenum alloy layer 503 isolates the second conductive metal layer 502 and the second oxide molybdenum alloy layer 504, to prevent galvanic corrosion between the second conductive metal layer 502 and the second molybdenum oxide alloy layer 504.

A material of the second conductive metal layer 502 can be one or more of copper, aluminum, and silver.

A material of the second molybdenum alloy layer 503 includes at least one of titanium, nickel, tantalum, tungsten, or niobium.

It should be noted that the material of the second molybdenum alloy layer 503 mainly includes at least one of titanium, nickel, tantalum, tungsten, or niobium doped in the molybdenum metal to form a molybdenum alloy.

Specifically, the passivation layer 60 is provided with a through-hole 80 penetrating the passivation layer 60 and the second molybdenum oxide alloy layer 504, and the pixel electrode layer 70 is in contact with the second molybdenum alloy layer 503 through the through-hole 80.

In one embodiment, the source-drain metal layer 50 includes a source electrode 51 and a drain electrode 52, which are separately disposed on two sides of the active layer 40 and are electrically connected to the active layer 40. The through-hole 80 penetrates the passivation layer 60 and the second molybdenum oxide layer 504 of the drain electrode 52, and the pixel electrode layer 70 is in contact with the second molybdenum alloy layer 503 of the drain electrode 52.

It should be noted that the through-hole 80 may also be provided to penetrate the passivation layer 60 and extend to the surface of the second conductive metal layer 502, and the pixel electrode layer 70 may be in contact with the second conductive metal layer 502 of the drain electrode 52 through the through-hole 80.

Based on the above display panel, the present disclosure also provides a method of manufacturing a display panel, including following steps:

S10: forming an array layer on a base substrate 10.

Figure 2:
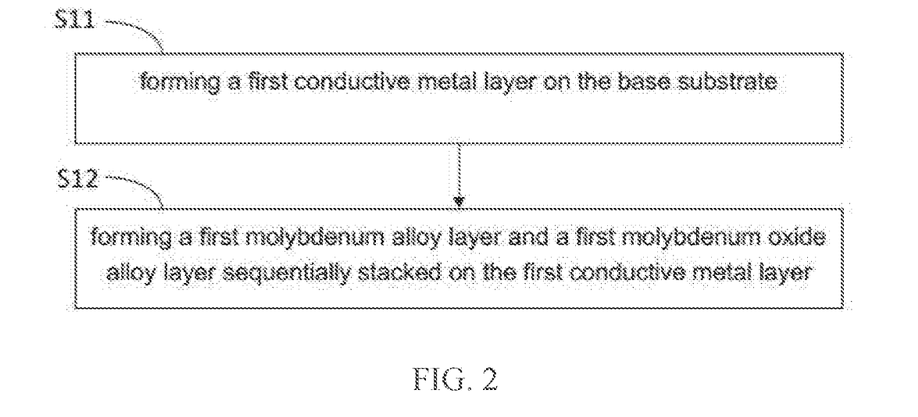
FIG. 2 is a schematic flowchart of step S10 in the present disclosure.

As shown in FIG. 2, FIG. 2 is a schematic flowchart of step S10, and the step S10 includes:

S11: forming a first conductive metal layer 22 on the base substrate 10;

S12: forming a first molybdenum alloy layer 23 and a first molybdenum oxide alloy layer 24 sequentially stacked on the first conductive metal layer 22.

Specifically, step S12 includes:

S121: forming a first molybdenum alloy film layer 91 on the first conductive metal layer 22 by using a molybdenum alloy;

S122: performing oxidation treatment on a surface of the first molybdenum alloy film layer 91 to form the first molybdenum oxide alloy layer 24 with a predetermined thickness.

After oxidizing the first molybdenum alloy film layer 91, an unoxidized portion of the first molybdenum alloy film layer 91 becomes the first molybdenum alloy layer 23. The manufacturing process of oxidizing the first molybdenum alloy film layer 91 to form the first molybdenum oxide alloy layer 24 is relatively simple, and easily produces a large-sized molybdenum oxide alloy film layer.

A thickness of the first molybdenum alloy layer 23 is 100 to 1000 angstroms, and a thickness of the first molybdenum oxide alloy layer 24 is 100 to 500 angstroms, to prevent oxidation of the first conductive metal layer 22.

It should be noted that the first molybdenum alloy film layer 91 can be oxidized by processes such as oxygen ion implantation, oxygen plasma treatment, or oxygen annealing treatment.

Specifically, before step S11, the method of manufacturing the display panel further includes:

S13: forming a first buffer layer 21 on the base substrate 10;

wherein the first conductive metal layer 22 is formed on the first buffer layer 21.

In one embodiment, the method of manufacturing the display panel includes:

S14: forming a gate insulating layer 30 on the base substrate 10 to cover the first conductive metal layer 22, the first molybdenum alloy layer 23, and the first molybdenum oxide alloy layer 24;

S15: forming an active layer 40 on the gate insulating layer 30; S16: forming a source-drain metal layer 50 electrically connected to the active layer 40 on the gate insulating layer 30;

S17: forming a passivation layer 60 covering the active layer 40, a source electrode 51 and a drain electrode 52; and S18: forming a pixel electrode layer 70 on the passivation layer 60;

wherein the source-drain metal layer 50 includes a second buffer layer 501 disposed on the passivation layer 60, a second conductive metal layer 502 disposed on the second buffer layer 501, and a second molybdenum alloy layer 503 and a second molybdenum oxide alloy layer 504 sequentially stacked on the second conductive metal layer 502.

Referring to FIGS. 3 to 10, FIGS. 3 to 10 are schematic diagrams of a manufacturing process of a display panel according to an embodiment of the present disclosure.

Figure 3:
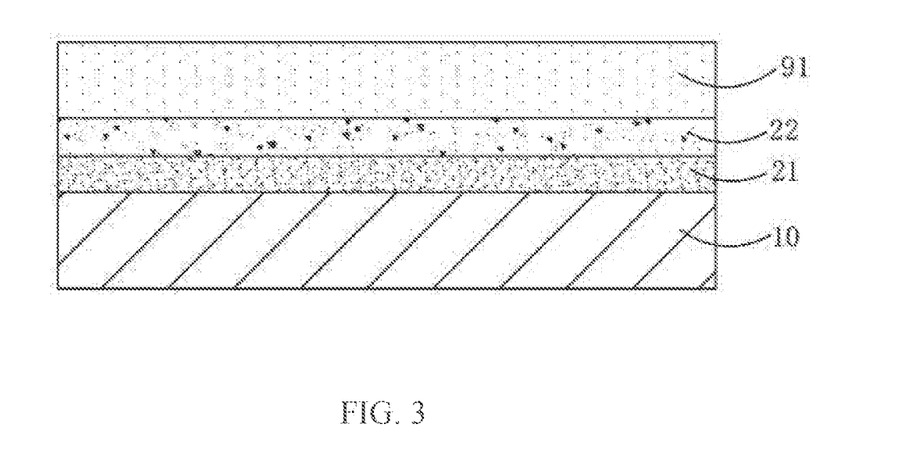
FIGS. 3 to 10 are schematic diagrams of a manufacturing process of a display panel according to an embodiment of the present disclosure.

As shown in FIG. 3, forming a first buffer layer 21, a first conductive metal layer 22, and a first molybdenum alloy film layer 91 to cover an entire surface of one side of a base substrate 10.

Figure 4:
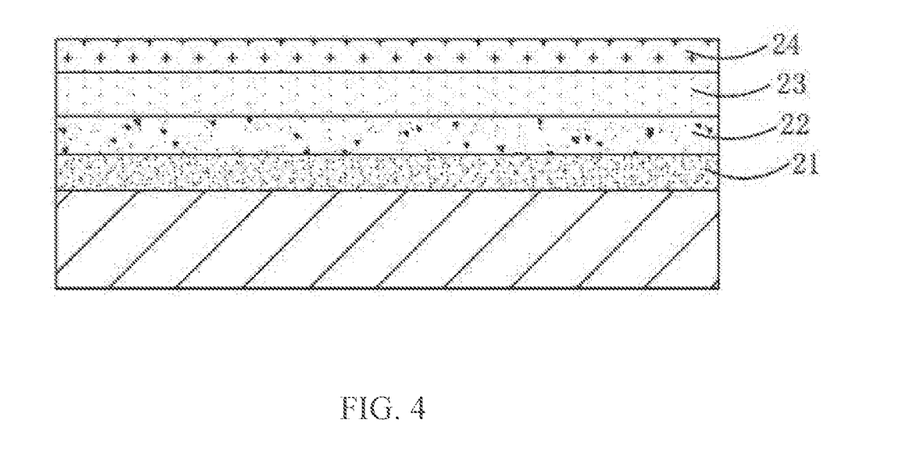

As shown in FIG. 4, performing oxidation treatment to a surface of the first molybdenum alloy film layer 91, to form a first molybdenum oxide alloy layer 24 with a predetermined thickness, to reduce a light reflectance of a surface of a gate layer 20.

Figure 5:
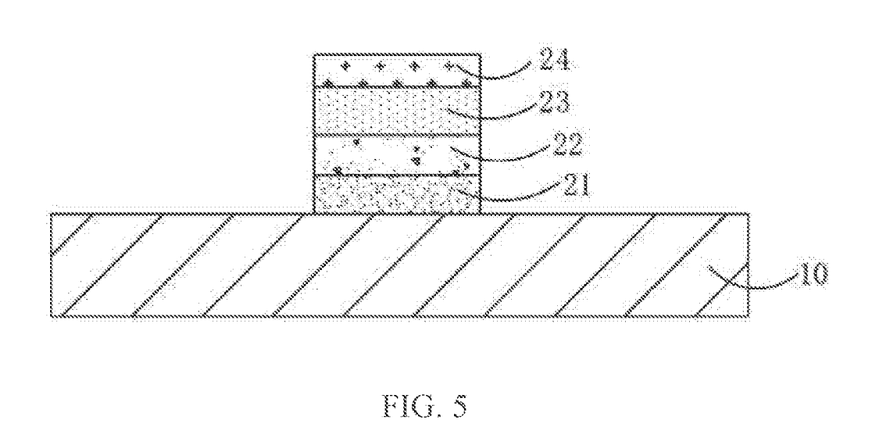

As shown in FIG. 5, patterning the first molybdenum oxide alloy layer 24, the first molybdenum alloy layer 23, the first conductive metal layer 22, and the first buffer layer 21 to form the gate layer 20.

Figure 6:
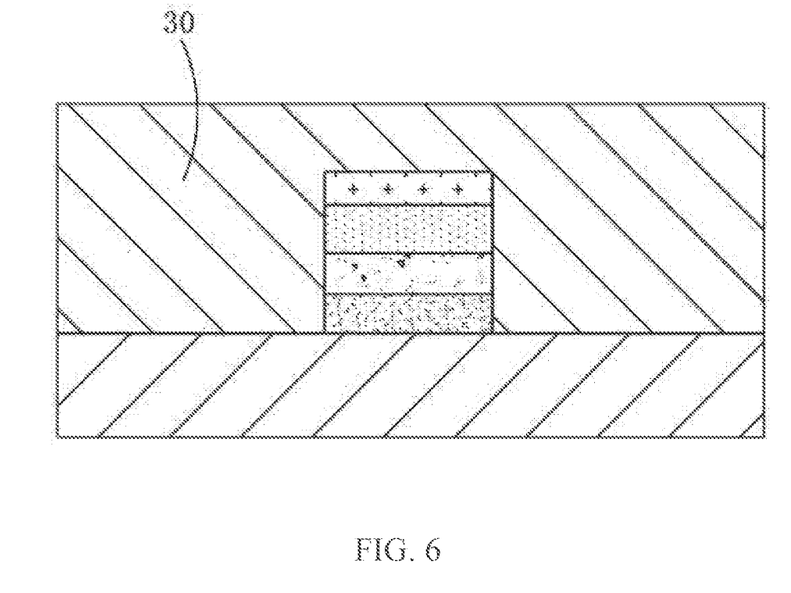

As shown in FIG. 6, forming a gate insulating layer 30 on the base substrate 10 to cover the first molybdenum oxide alloy layer 24, the first molybdenum alloy layer 23, the first conductive metal layer 22, and the first buffer layer 21.

Figure 7:
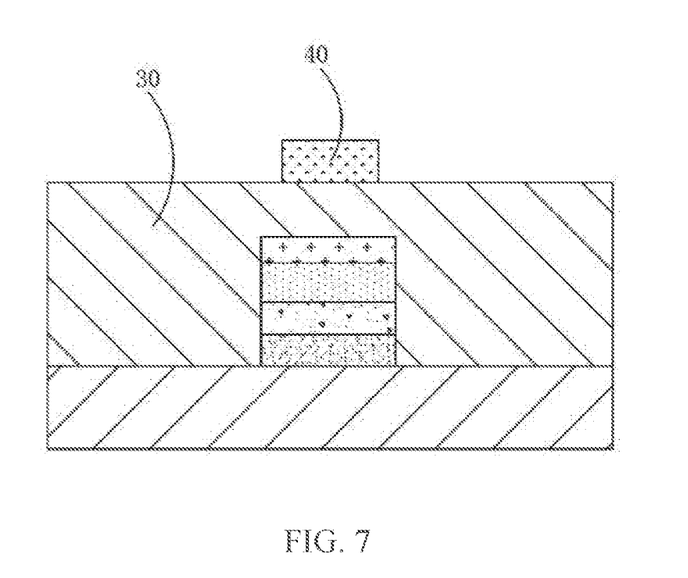

As shown in FIG. 7, forming an active layer 40 on the gate insulating layer 30, and patterning the active layer 40.

Figure 8:
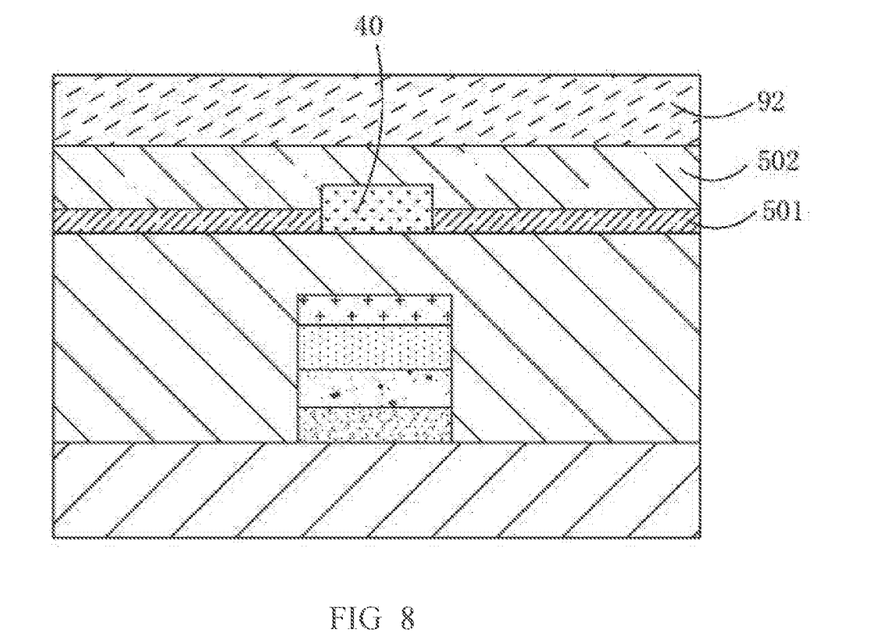

As shown in FIG. 8, forming a second buffer layer 501, a second conductive metal layer 502, and a second molybdenum alloy film layer 92 sequentially stacked on the gate insulating layer 30.

Figure 9:
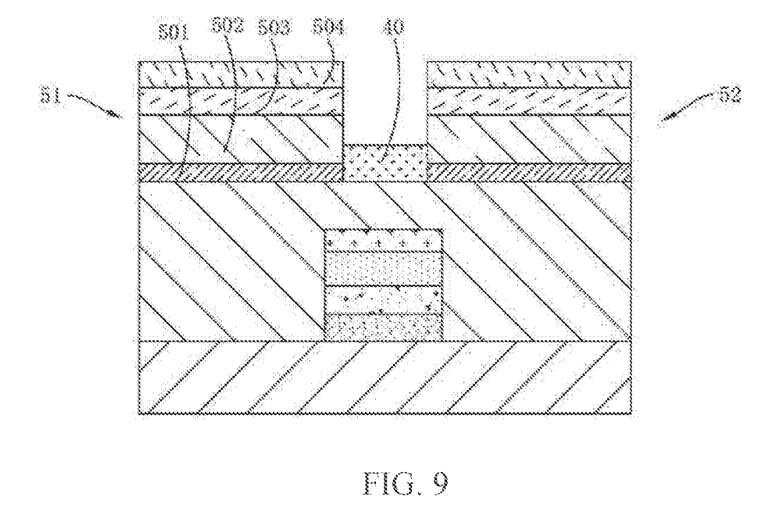

As shown in FIG. 9, after performing oxidation treatment to a surface of the to second molybdenum alloy film layer 92 to form a second molybdenum oxide alloy layer 504 with a predetermined thickness, etching part of the second conductive metal layer 502, a second molybdenum alloy layer 503, and the second molybdenum oxide alloy layer 504 corresponding to the active layer 40 to form a source electrode 51 and a drain electrode 52 separately disposed on two sides of the active layer 40.

After performing oxidation treatment to the second molybdenum alloy film layer 92, a non-oxidized portion of the second molybdenum alloy film layer 92 becomes the second molybdenum alloy layer 503.

A thickness of the second molybdenum alloy layer 503 is 100 to 1000 angstroms, and a thickness of the second molybdenum oxide alloy layer 504 is 100 to 500 angstroms.

Figure 10:
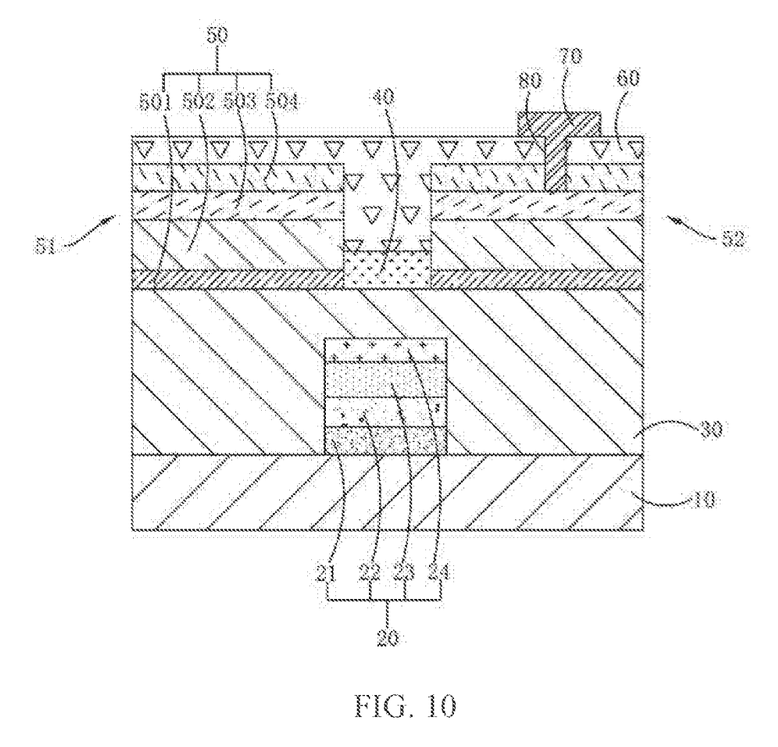

As shown in FIG. 10, forming a passivation layer 60 covering the active layer 40, the source electrode 51 and the drain electrode 52, forming a through-hole 80 penetrating the passivation layer 60 and extending to the surface of the second molybdenum alloy layer 503 of the drain electrode 52 layer, and forming a pixel electrode layer 70 on the passivation layer 60. The pixel electrode layer 70 fills the through-hole 80 and contacts the second molybdenum alloy layer 503 of the drain electrode 52.

The beneficial effect of the present disclosure is: using a first molybdenum oxide alloy layer 24 disposed on a first conductive metal layer 22 to reduce a light reflectance of a surface of a gate layer 20, and using a second molybdenum oxide alloy layer 504 disposed on a second conductive metal layer 502 to reduce a light reflectance of a surface of a source electrode 51 and a drain electrode 52, thereby preventing a high light reflectance from affecting a visual effect of a product, while preventing galvanic corrosion between the first conductive metal layer 22 and the first molybdenum oxide alloy layer 24 through the first molybdenum alloy layer 23, and preventing galvanic corrosion between the second conductive metal layer 502 and the second molybdenum oxide alloy layer 504 through the second molybdenum alloy layer 503.

In the above embodiments, the description of each embodiment has its emphasis. For a part that is not described in detail in one embodiment, reference may be made to related descriptions in other embodiments.

The principle and implementation of the present disclosure are explained with specific embodiments. The descriptions of the above embodiments are only used to help understand the technical solutions of the present disclosure. Those skilled in the art should understand that modifications to the technical solutions described in the foregoing embodiments or equivalent replacement of some of the technical features thereof do not depart from the scope of the technical solutions of the embodiments of the present disclosure.

What is claimed is:

1. A display panel, wherein the display panel comprises a base substrate and an array layer disposed on the base substrate, and the array layer comprises a gate layer disposed on the base substrate;
   wherein the gate layer comprises a first conductive metal layer, and a first molybdenum alloy layer and a first molybdenum oxide alloy layer sequentially stacked on the first conductive metal layer,
   wherein a material of the first conductive metal layer comprises at least one of copper, aluminum, or silver;
   wherein the first molybdenum alloy layer covers the first conductive metal layer, and the first molybdenum oxide alloy layer covers the first molybdenum alloy layer; and
   wherein a thickness of the first molybdenum oxide alloy layer is less than or equal to a thickness of the first molybdenum alloy layer.

2. The display panel as claimed in claim 1, wherein the gate layer further comprises a first buffer layer disposed between the first conductive metal layer and the base substrate, the first buffer layer is disposed on the base substrate, and the first conductive metal layer is disposed on the first buffer layer.

3. The display panel as claimed in claim 1, wherein the array layer further comprises:
   a gate insulating layer covering the gate layer;
   an active layer disposed on the gate insulating layer and a source-drain metal layer electrically connected to the active layer;
   a passivation layer covering the active layer and the source-drain metal layer; and
   a pixel electrode layer disposed on the passivation layer;
   wherein the source-drain metal layer comprises a second buffer layer disposed on the passivation layer, a second conductive metal layer disposed on the second buffer layer, and a second molybdenum alloy layer and a second molybdenum oxide alloy layer sequentially stacked on the second conductive metal layer.

4. The display panel as claimed in claim 3, wherein the pixel electrode layer is in contact with the second molybdenum alloy layer through a through-hole penetrating the passivation layer and the second molybdenum oxide alloy layer.

5. The display panel as claimed in claim 3, wherein a material of the first molybdenum alloy layer and the second molybdenum alloy layer comprises at least one of titanium, nickel, tantalum, tungsten, or niobium.

6. A display panel, wherein the display panel comprises a base substrate and an array layer disposed on the base substrate, and the array layer comprises a gate layer disposed on the base substrate;
   wherein the gate layer comprises a first conductive metal layer, and a first molybdenum alloy layer and a first molybdenum oxide alloy layer sequentially stacked on the first conductive metal layer,
   wherein the first molybdenum alloy layer covers the first conductive metal layer, and the first molybdenum oxide alloy layer covers the first molybdenum alloy layer; and
   wherein a thickness of the first molybdenum oxide alloy layer is less than or equal to a thickness of the first molybdenum alloy layer.

7. The display panel as claimed in claim 6, wherein the gate layer further comprises a first buffer layer disposed between the first conductive metal layer and the base substrate, the first buffer layer is disposed on the base substrate, and the first conductive metal layer is disposed on the first buffer layer.

8. The display panel as claimed in claim 6, wherein the array layer further comprises:
   a gate insulating layer covering the gate layer;
   an active layer disposed on the gate insulating layer and a source-drain metal layer electrically connected to the active layer;
   a passivation layer covering the active layer and the source-drain metal layer; and
   a pixel electrode layer disposed on the passivation layer;
   wherein the source-drain metal layer comprises a second buffer layer disposed on the passivation layer, a second conductive metal layer disposed on the second buffer layer, and a second molybdenum alloy layer and a second molybdenum oxide alloy layer sequentially stacked on the second conductive metal layer.

9. The display panel as claimed in claim 8, wherein the pixel electrode layer is in contact with the second molybdenum alloy layer through a through-hole penetrating the passivation layer and the second molybdenum oxide alloy layer.

10. The display panel as claimed in claim 8, wherein a material of the first molybdenum alloy layer and the second molybdenum alloy layer comprises at least one of titanium, nickel, tantalum, tungsten, or niobium.

11. A method of manufacturing a display panel, comprising following steps:
- S10: forming an array layer on a base substrate;
- wherein the step S10 comprises:
- S11: forming a first conductive metal layer on the base substrate;
- S121: forming a first molybdenum alloy film layer on the first conductive metal layer by using a molybdenum alloy; and
- S122: performing oxidation treatment on a surface of the first molybdenum alloy film layer to form the first molybdenum oxide alloy layer with a predetermined thickness.

12. The method of manufacturing the display panel as claimed in claim 11, wherein before the step S11, the method of manufacturing the display panel further comprises:
- S13: forming a first buffer layer on the base substrate;
- wherein the first conductive metal layer is formed on the first buffer layer.

13. The method of manufacturing the display panel as claimed in claim 11, wherein the step S10 further comprises:
- S14: forming a gate insulating layer on the base substrate covering the first conductive metal layer, the first molybdenum alloy layer, and the first molybdenum oxide alloy layer;
- S15: forming an active layer on the gate insulating layer;
- S16: forming a source-drain metal layer electrically connected to the active layer on the gate insulating layer;
- S17: forming a passivation layer covering the active layer and the source-drain metal layer; and
- S18: forming a pixel electrode layer on the passivation layer;
- wherein the source-drain metal layer comprises a second buffer layer disposed on the passivation layer, a second conductive metal layer disposed on the second buffer layer, and a second molybdenum alloy layer and a second molybdenum oxide alloy layer sequentially stacked on the second conductive metal layer.

* * * * *